United States Patent
Yu et al.

(10) Patent No.: US 7,130,238 B1
(45) Date of Patent: Oct. 31, 2006

(54) DIVISIBLE TRUE DUAL PORT MEMORY SYSTEM SUPPORTING SIMPLE DUAL PORT MEMORY SUBSYSTEMS

(75) Inventors: Haiming Yu, San Jose, CA (US); Wei Yee Koay, Penang (MY)

(73) Assignee: Altera Corporation, San Jose, CA (US)

( * ) Notice: Subject to any disclaimer, the term of this patent is extended or adjusted under 35 U.S.C. 154(b) by 21 days.

(21) Appl. No.: 11/041,120

(22) Filed: Jan. 21, 2005

(51) Int. Cl.
*G11C 8/05* (2006.01)

(52) U.S. Cl. .......................... 365/230.05; 365/189.02; 365/230.03

(58) Field of Classification Search .......... 365/230.05, 365/189.02, 130.03, 154
See application file for complete search history.

(56) References Cited

U.S. PATENT DOCUMENTS

| | | | |
|---|---|---|---|
| 5,796,269 A | 8/1998 | New | |
| 6,052,327 A | 4/2000 | Reddy et al. | |
| 6,262,932 B1 * | 7/2001 | Nguyen | 365/230.05 |
| 6,462,577 B1 | 10/2002 | Lee et al. | |
| 6,467,017 B1 | 10/2002 | Ngai et al. | |
| 6,486,702 B1 | 11/2002 | Ngai et al. | |
| 6,661,733 B1 | 12/2003 | Pan et al. | |
| 6,826,110 B1 * | 11/2004 | Dhong et al. | 365/189.02 |

\* cited by examiner

*Primary Examiner*—Huan Hoang
(74) *Attorney, Agent, or Firm*—Townsend and Townsend and Crew LLP (57) ABSTRACT

A random access memory circuit and a method for configuring the same. The circuit includes a first array of memory cells including a first plurality of ports and a second plurality of ports, and a second array of memory cells including a third plurality of ports and a fourth plurality of ports. Additionally, the circuit includes a plurality of switches connected to the first plurality of ports and the third plurality of ports respectively or connected to the second plurality of ports and the fourth plurality of ports respectively. Moreover, the circuit includes a plurality of sense amplifiers and a plurality of write drivers.

20 Claims, 6 Drawing Sheets

DIVISIBLE TRUE DUAL PORT MEMORY SYSTEM SUPPORTING SIMPLE DUAL PORT MEMORY SUBSYSTEMS

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates generally to memory systems. More specifically, the invention provides a divisible true dual port (TDP) memory system supporting simple dual port (SDP) memory subsystems. Merely by way of example, the invention has been applied to field-programmable gate arrays (FPGAs), but it would be recognized that the invention has a much broader range of applicability.

An FPGA system often includes an embedded memory system. The embedded memory system can be used to provide various types of memory functions. The memory functions include, for example, those of first-in-first-out memory (FIFO), read-only memory (ROM), and random-access memory (RAM). As RAM, the embedded memory system can be configured to support different types of operation modes. The operation modes may include true dual port (TDP), simple dual port (SDP), and single port (SP). A TDP memory system can support two writes, one read and one write, or two reads at one time. Besides having two independent in/out (IO) data paths and address decoders, the TDP memory system includes two independent write bit-lines drivers and sense amplifiers to support two writes or two reads simultaneously. In contrast, a SDP memory system can support one read and one write at the same time. The SDP memory system can be built from a TDP memory system by using one particular port to write and the other to read.

For example, a conventional 8K TDP SRAM memory includes 256 rows and 32 columns of dual port RAM cells. Each column of the RAM cells is accessible through Port A and Port B differential bit-lines with their respective Port A and Port B write drivers, sense amplifiers, and column and row decoder circuitry. For TDP operation, two-read, one-read and one-write, or two-write operations can be performed simultaneously. For SDP operation, one read and one write can be performed simultaneously. Port A is used as write port, and port B is used as read port.

The conventional SRAM system usually cannot be divided effectively into several SRAM sub-systems. Hence it is desirable to improve techniques for memory systems.

BRIEF SUMMARY OF THE INVENTION

The present invention relates generally to memory systems. More specifically, the invention provides a divisible true dual port (TDP) memory system supporting simple dual port (SDP) memory subsystems. Merely by way of example, the invention has been applied to field-programmable gate arrays (FPGAs), but it would be recognized that the invention has a much broader range of applicability.

An embodiment of the present invention provides a random access memory circuit. The circuit includes a first array and a second array of memory cells. Each memory array includes ports A and ports B. Additionally, the circuit includes switches that are connected to ports A of the first memory array and the second memory array, or connected to ports B of the first memory array and the second memory array. Moreover, the circuit includes sense amplifiers that can receive signals selectively from at least ports A and B of the first memory array. Also, the circuit includes write drivers that can output signals selectively to at least ports A and B of the second memory array. Ports A of the first memory array may be different from ports A of the second memory array, and ports B of the first memory array may be different from ports B of the second memory array.

Many benefits are achieved by way of the present invention over conventional techniques. For example, some embodiments of the present invention provide an M-bit width and N-bit size TDP/SDP memory block that can be used as two independent M-bit width and N/2-bit size SDP memory blocks. Certain embodiments of the present invention provide flexibility to a memory system. For a given memory area, the number of memory blocks and the bit density is often a tradeoff. For example, an embedded memory structure with large memory blocks often has a high bit density but a low block count. In contrast, an embedded memory with small memory blocks often has a low bit density but a high block count. Some embodiments of the present invention can satisfy different memory demands in FPGA applications. For example, some applications need large memory blocks with low block count. In contrast, other applications need small memory blocks with high block count. Depending on the applications, the M-bit width and N-bit size memory can be used as a single block for TDP or SDP operations, or used as two independent blocks for SDP operations. Certain embodiments of the present invention provide configurable memory block in FPGA fabric that supports a configurable data width and various operation modes including TDP, SDP and Single Port (SP) mode.

Depending upon embodiment, one or more of these benefits may be achieved. These benefits and various additional objects, features and advantages of the present invention can be fully appreciated with reference to the detailed description and accompanying drawings that follow.

BRIEF DESCRIPTION OF THE DRAWINGS

FIG. 1, including

FIGS. 6(A), (B) and (C) show a simplified comparison between a divisible 32-bit width and 8K-bit size memory block and conventional memory structures according to an embodiment of the present invention.

DETAILED DESCRIPTION OF THE INVENTION

The present invention relates generally to memory systems. More specifically, the invention provides a divisible true dual port (TDP) memory system supporting simple dual port (SDP) memory subsystems. Merely by way of example, the invention has been applied to field-programmable gate arrays (FPGAs), but it would be recognized that the invention has a much broader range of applicability.

Figure 1A:
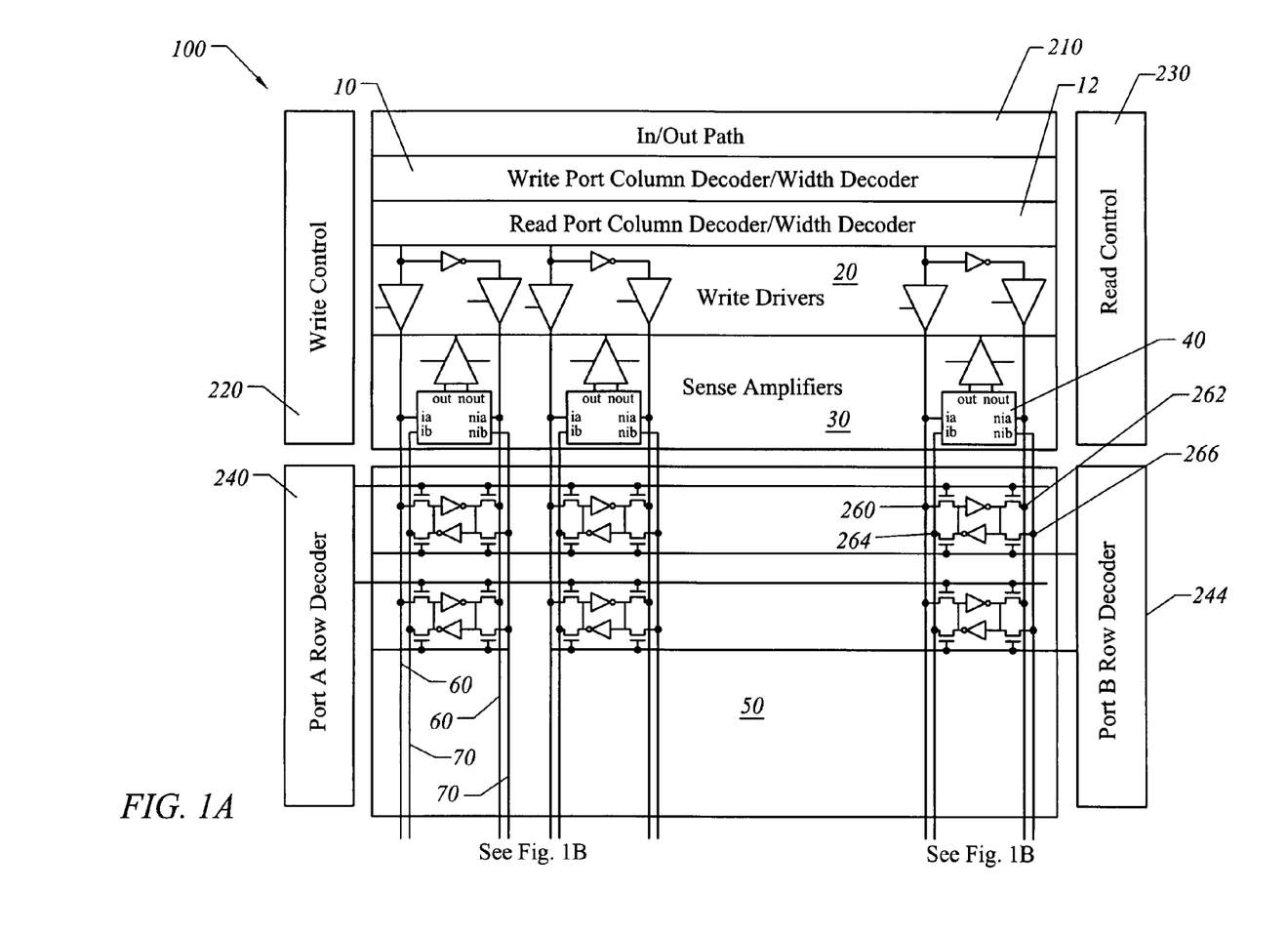
FIGS. 1A and 1B, is a simplified divisible memory system according to an embodiment of the present invention.
Figure 1B:
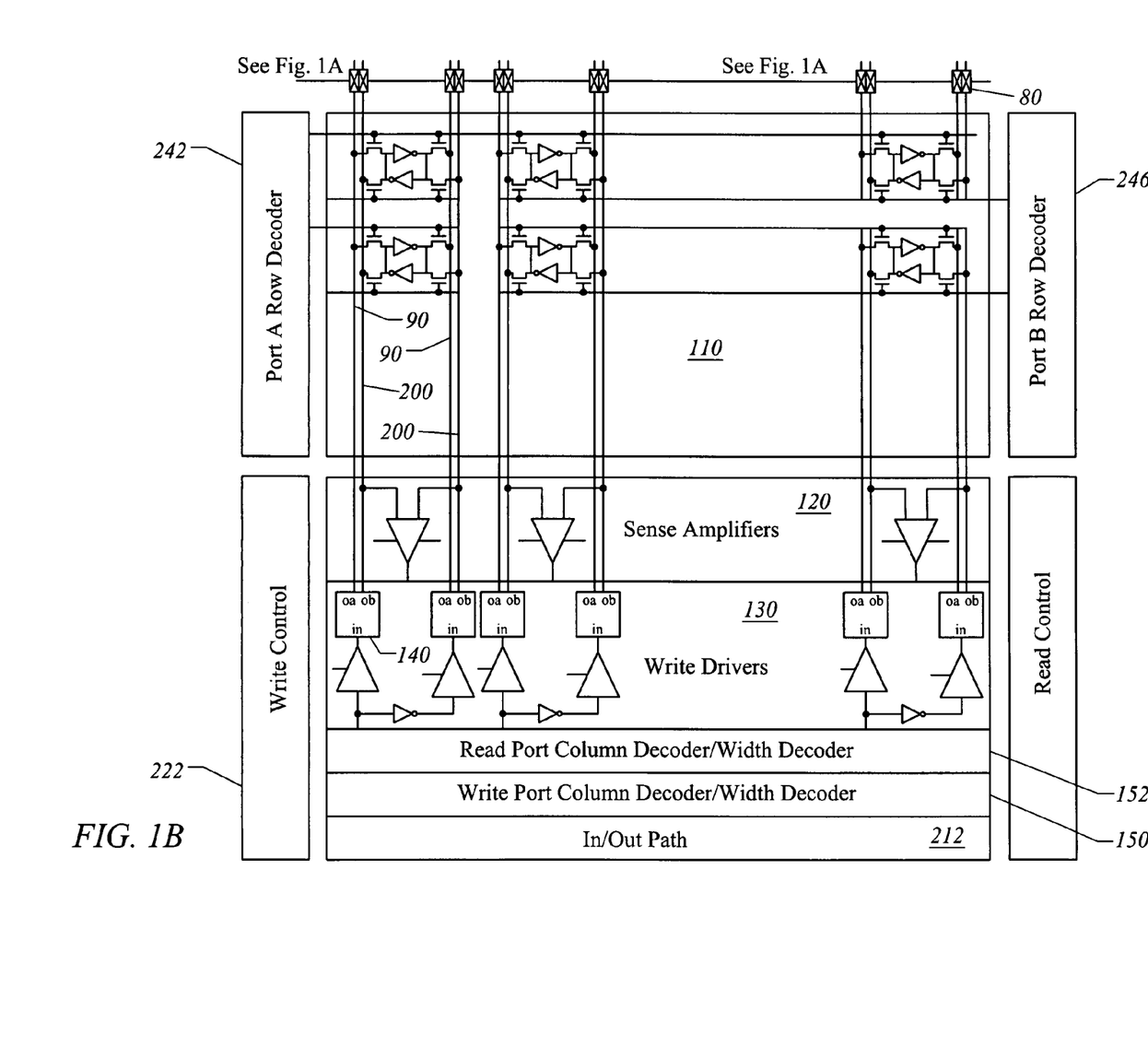

FIG. 1 is a simplified divisible memory system according to an embodiment of the present invention. This diagram is merely an example, which should not unduly limit the scope of the claims herein. The circuit 100 includes column decoders 10, 12, 150 and 152, write drivers 20 and 130, sense amplifiers 30 and 120, multiplexers 40, demultiplexers 140, memory arrays 50 and 110, bit-lines 60, 70, 90 and 200, switches 80. Additionally, the circuit 100 includes in/out paths 210 and 212, write controls 220 and 222, read controls 230 and 232, and row decoders 240, 242, 244, and 246. Although the above has been shown using a selected group of components, there can be many alternatives, modifications, and variations. Depending upon the embodiment, the specific arrangements of components may be interchanged with others replaced. Further details of these components are found throughout the present specification and more particularly below.

The memory arrays 50 and 110 include a plurality of memory cells. In one embodiment, the memory arrays 50 and 110 have the same number of memory cells. For example, the memory arrays 50 and 110 each include an array of static random access memory (SRAM) cells of 128 rows and 32 columns. As another example, the memory arrays 50 and 110 each are a 4K memory block. In another embodiment, the memory arrays 50 and 110 have different numbers of memory cells and/or different storage sizes. Each memory cell has two types of input/output ports, such as port A and port B. For example, as shown in FIG. 1, ports 260 and 262 are ports A, and ports 264 and 266 are ports B.

The write drivers 20 are connected to port A of each memory cell, and the write drivers 130 are connected to port A or port B of each memory cell through the demultiplexers 140. For example, the write drivers 20 include 32 write drivers, and the write drivers 130 include 32 write drivers. The sense amplifiers 30 are connected to port A or port B of each memory cell through the multiplexers 40, and the sense amplifiers 120 are connected to port B of each memory cell. For example, the sense amplifiers 30 include 32 sense amplifiers, and the sense amplifiers 120 include 32 sense amplifiers. The bit lines 60 are connected to port A of each memory cell in the memory 50, and the bit lines 70 are connected to port B of each memory cell in the memory 50. The bit lines 90 are connected to port A of each memory cell in the memory 110, and the bit lines 200 are connected to port B of each memory cell in the memory 110.

The multiplexers 40 each receive inputs from the bit lines 60 and 70 and output signals to the sense amplifiers 30. In one embodiment, the multiplexers 40 are 4:2 multiplexers. Each of the multiplexers 40 has four input ports ia, nia, ib and nib, and two output ports out and nout. The input ports ia and nia are connected to the bit lines 60, and the input ports ib and nib are connected to the bit lines 70. The two output ports out and nout are connected to one of the sense amplifiers 40. The output signals at the ports out and nout are determined by a control signal. For example, the multiplexers 40 select signals carried by either bit lines 60 or bit lines 70 as inputs to the sense amplifiers 30.

Figure 2:
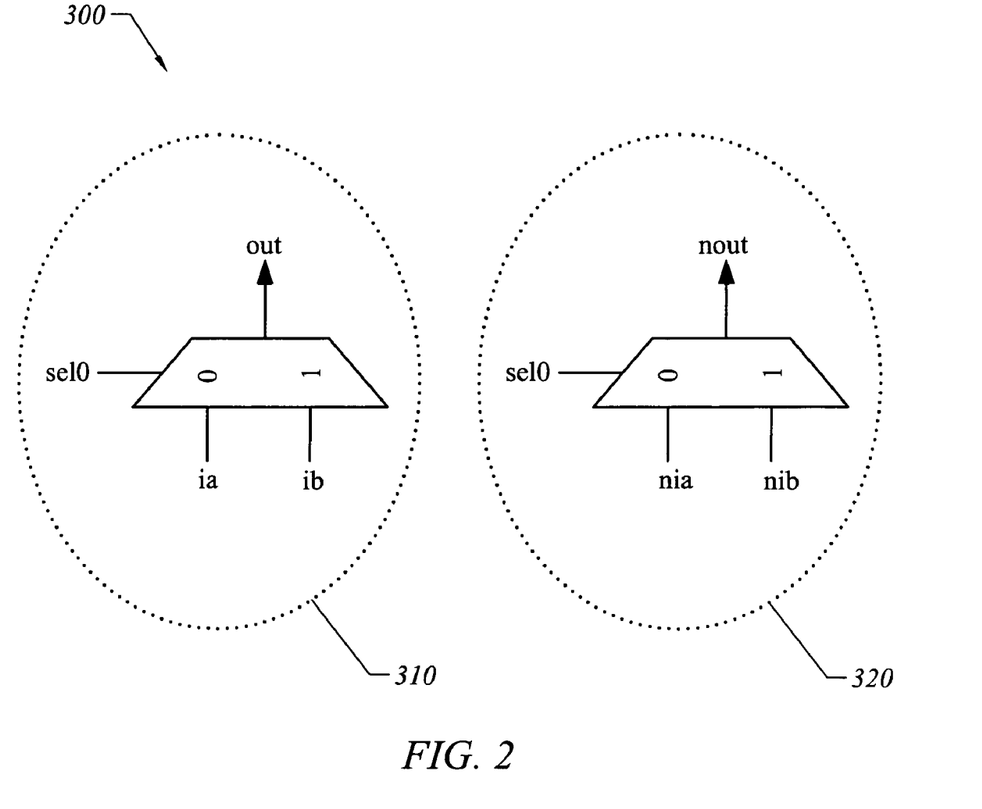
FIG. 2 is a simplified multiplexer used for a divisible memory system according to an embodiment of the present invention.

FIG. 2 is a simplified multiplexer used for a divisible memory system according to an embodiment of the present invention. This diagram is merely an example, which should not unduly limit the scope of the claims herein. The multiplexer 300 includes two 2:1 multiplexers 310 and 320. The multiplexer 310 includes input ports ia and ib and an output port out, and the multiplexer 320 includes input ports nia and nib and an output port nout. Each of these two multiplexers also receives a control signal sel0. In one embodiment, the multiplexer 300 is used as each of the multiplexers 40.

The demultiplexers 140 each receive an input from the write drivers 130 and output signals to the bit lines 90 and 200. In one embodiment, the demultiplexers 140 are 1:2 demultiplexers. Each of the demultiplexers 140 has an input port in, and two output ports oa and ob. The input port in receives a signal from one of the write drivers 130, and the two output ports oa and ob are each connected to the bit lines 90 and 200. The output signals at the ports oa and ob are determined by a control signal. For example, the demultiplexers 140 select either bit lines 90 or bit lines 200 to receive the signals from the write drivers 130.

Figure 3:
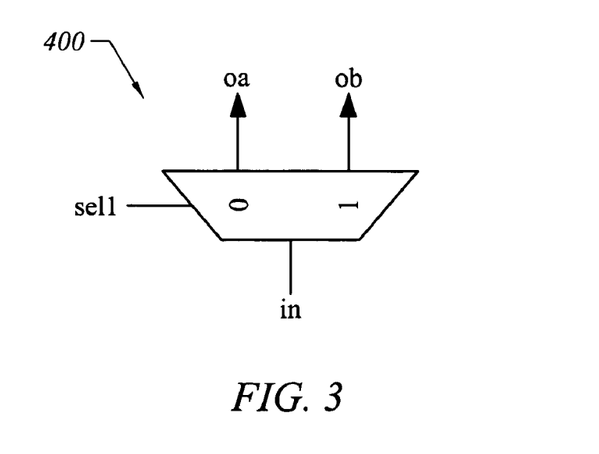
FIG. 3 is a simplified demultiplexer used for a divisible memory system according to an embodiment of the present invention.

FIG. 3 is a simplified demultiplexer used for a divisible memory system according to an embodiment of the present invention. This diagram is merely an example, which should not unduly limit the scope of the claims herein. The demultiplexer 400 includes input port in and two output ports oa and ob, and receives a control signal sel1. In one embodiment, the demultiplexer 400 is used as each of the multiplexers 140.

The switches 80 are connected with either bit lines 60 and 90 or bit lines 70 and 200. In one embodiment, each switch receives a control signal, which determines whether the switch is closed or open. For example, the switches 80 are open so that the bit lines 60 and 90 are not shorted, and/or the bit lines 70 and 200 are not shorted. As another example, the switches 80 are closed so that the bit lines 60 and 90 are shorted and/or the bit lines 70 and 200 are shorted. In one embodiment, the switches 80 include pass gates. For example, each pass gate includes a CMOS. As another example, the switches are closed if the pass gates are turned on. In one embodiment, the switches 80 each receive a control signal, which in turn determine whether the two ports of switches are connected or disconnected.

The column decoders 10 are connected to and control the write drivers for the memory array 50, and the column decoders 12 are connected to and control the sense amplifiers for the memory array 50. Additionally, the column decoders 150 are connected to and control the write drivers for the memory array 110, and the column decoders 152 are connected to and control the sense amplifiers for the memory array 110. The column decoders 10 and 150 are activated for write operations, and the column decoders 12 and 152 are activated for read operations.

The row decoders 240 and 244 correspond to port A and port B respectively of each memory cell of the memory array 50. For example, the row decoders 240 and 244 each are a 7:128 decoder. The row decoders 242 and 246 correspond to port A and port B respectively of each memory cell of the memory array 110. For example, the row decoders 242 and 246 each are a 7:128 decoder.

The in/out paths 210 can transmit data to be written to or to be read from ports A and B of the memory array 50, and the in/out paths 212 can transmit data to be written to or to be read from ports A and B of the memory array 110. The write control 220 and the read control 230 can provide control signals for the memory array 50, and the write control 222 and the read control 232 can provide control signals for the memory 110.

As shown in FIGS. 1–3, the circuit 100 includes the memory arrays 50 and 110 according to an embodiment of the present invention. The memory arrays 50 and 110 can be configured to a single memory block capable of TDP and SDP operations, or two independent memory blocks each capable of SDP operations. Whether the memory arrays 50 and 110 can operate as a single memory block or two independent memory blocks depends on the control signals received by the switches 80, the control signals received by the multiplexers 40, and the control signals received by the demultiplexers 140. For example, the control signals received by the switches 80 determine whether the switches 80 are closed or open. The control signals received by the multiplexers 40 determine the relationship between the input signals and the output signals of the multiplexers 40. The control signals received by the demultiplexers 140 determine the relationship between the input signals and the output signals of the demultiplexers 140. In the TDP mode, the circuit 100 can support two writes, one read and one write, or two reads at one time to the memory blocks 50 and 110 acting as a single memory block. In the SDP mode, the circuit 100 can support one read and one write at one time to the memory blocks 50 and 110 acting as a single memory block, or support one read and one write at one time to each of the memory blocks 50 and 110 acting as two independent memory blocks.

For example, the memory arrays 50 and 110 each include an M-bit width and N/2-bit size memory block. In another example, the circuit 100 can operate as an M-bit width and N-bit size memory block capable of TDP and SDP operations, and as two independent M-bit width and N/2-bit size memory blocks each capable of SDP operation. M is a positive integer, and N is a positive even integer. For example, M equals 32 and N equals 8K. Whether the system functions as an M-bit width and N-bit size memory block or two independent M-bit width and N/2-bit size memory blocks, or operates in the TDP mode or the SDP mode depends on at least settings of the switches 80, the multiplexers 40, and the demultiplexers 140. Table 1 describes settings of the switches 80, the multiplexers 40, and the demultiplexers 140 for different modes of operations according to an embodiment of the present invention.

TABLE 1

|  | M-Bit Width and N-Bit Size | | M-Bit Width and N/2-Bit Size |
|---|---|---|---|
|  | TDP | SDP | SDP |
| Switches 80 | closed | closed | open |
| Multiplexers 40 |  |  |  |
| sel0 | 0 | 0 | 1 |
| out | ia | ia | ib |
| nout | nia | nia | nib |
| Demultiplexers 140 |  |  |  |
| sel1 | 1 | 1 | 0 |
| oa | z | z | in |
| ob | in | in | z |

As shown in Table 1, "z" represents high impedance or open circuit. The circuit 100 can support an M-bit width and N-bit size memory block in the TDP mode or the SDP mode if the switches 80 are closed, the control signal sel0 is set to 0, and the control signal sel1 is set to 1. The closed switches 80 can connect the bit lines 60 with the bit lines 90 and connect the bit lines 70 with the bit lines 200. In the TDP mode, the write drivers 20 and the sense amplifiers 30 can access to the bit lines 60 and 90 with sel0 set to 0. The write drivers 130 and the sense amplifiers 120 can access to the bit lines 70 and 200 with sel1 set to 1. In the SDP mode, port A of each memory cell is used as a write port, and port B of each memory cell is used as a read port. With sel0 set to 0 and sel1 set to 1, the write drivers 20 can access to the bit lines 60 and 90, and the sense amplifiers 120 can access to the bit lines 70 and 200.

Additionally, the circuit 100 can support two independent M-bit width and N/2-bit size memory blocks in the SDP mode if the switches 80 are open, the control signal sel0 is set to 1, and the control signal sel1 is set to 0. The open switches 80 can disconnect the bit lines 60 from the bit lines 90 and disconnect the bit lines 70 from the bit lines 200. With sel0 set to 1, for the memory array 50, the write drivers 20 can access to the bit lines 60, and the sense amplifiers 30 can access the bit lines 70. Port A of each memory cell of the memory array 50 is used as a write port, and port B of each memory cell of the memory array 50 is used as a read port. With sel1 set to 0, for the memory array 110, the write drivers 130 can access to the bit lines 90, and the sense amplifiers 120 can access the bit lines 200. Port A of each memory cell of the memory array 110 is used as a write port, and port B of each memory cell of the memory array 110 is used as a read port.

As discussed above and further emphasized here, FIGS. 1–3 are merely examples, which should not unduly limit the scope of the claims herein. For example, the circuit 100 includes more than two memory arrays. In another example, the memory arrays 50 and 110 each include M columns and L/2 rows. In yet another example, the memory arrays 50 and 110 each include an M-width N/2-bit size memory block. M is a positive integer, and L and N are positive even integers.

Figure 4:
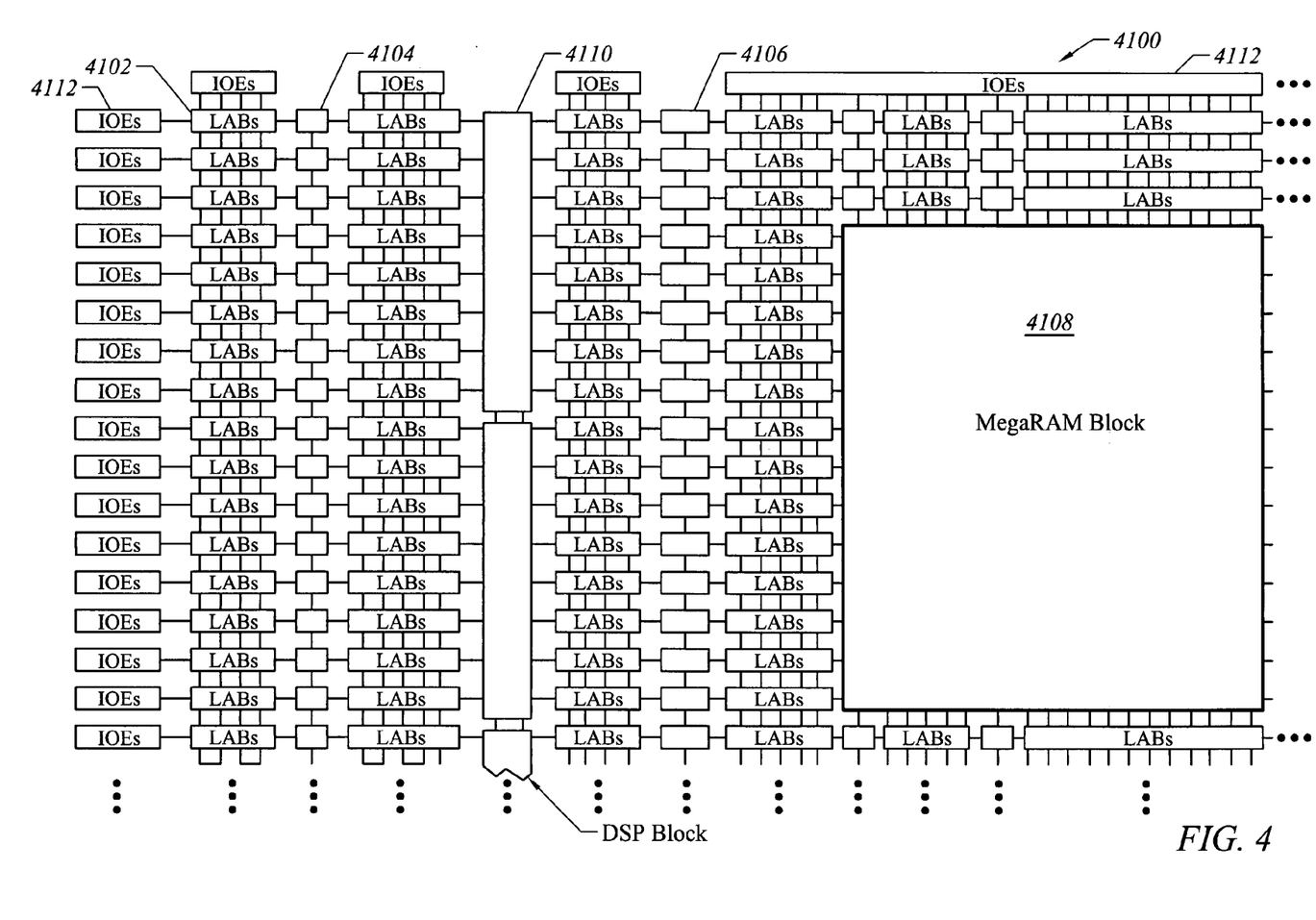
FIG. 4 is a simplified partial block diagram of an exemplary high-density programmable logic device.

The present invention has various applications. Certain embodiments of the present invention provide embedded memory systems to integrated circuit systems. For example, some embodiments of the present invention provide embedded memory systems to programmable logic devices. FIG. 4 is a simplified partial block diagram of an exemplary high-density programmable logic device (PLD) 4100 wherein techniques according to the present invention can be utilized. The PLD 4100 includes a two-dimensional array of programmable logic array blocks (LABs) 4102 that are interconnected by a network of column and row interconnections of varying length and speed. The LABs 4102 include multiple (e.g., 10) logic elements (LEs), an LE being a small unit of logic that provides for efficient implementation of user defined logic functions.

The PLD 4100 also includes a distributed memory structure including RAM blocks of varying sizes provided throughout the array. The RAM blocks include, for example, 512 bit blocks 4104, 4K blocks 4106 and an M-Block 4108 providing 512K bits of RAM. These memory blocks may also include shift registers and FIFO buffers. The PLD 4100 further includes digital signal processing (DSP) blocks 4110 that can implement, for example, multipliers with add or subtract features.

It is to be understood that the PLD 4100 is described herein for illustrative purposes only and that the present invention can be implemented in many different types of PLDs, FPGAs, and the other types of digital integrated circuits.

Figure 5:
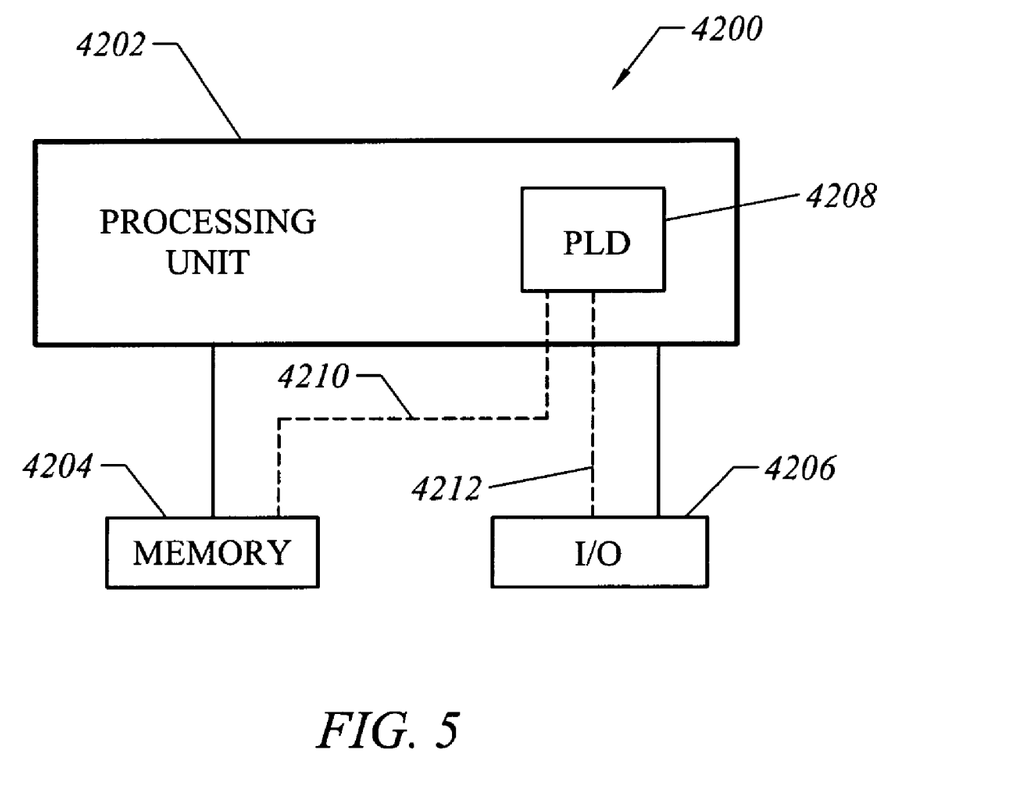
FIG. 5 shows a block diagram of an exemplary digital system.

While the PLDs of the type shown in FIG. 4 provide many of the resources required to implement system level solutions, the present invention can also benefit systems wherein a PLD is one of several components. FIG. 5 shows a block diagram of an exemplary digital system 4200, within which the present invention may be embodied. The system 4200 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, the system 4200 may be provided on a single board, on multiple boards, or within multiple enclosures.

The system 4200 includes a processing unit 4202, a memory unit 4204 and an I/O unit 4206 interconnected together by one or more buses. According to this exemplary embodiment, a programmable logic device (PLD) 4208 is embedded in the processing unit 4202. The PLD 4208 may serve many different purposes within the system in FIG. 8. The PLD 4208 can, for example, be a logical building block of the processing unit 4202, supporting its internal and external operations. The PLD 4208 is programmed to implement the logical functions necessary to carry on its particular role in system operation. The PLD 4208 may be specially coupled to the memory unit 4204 through connection 4210 and to the I/O unit 4206 through connection 4212.

The processing unit 4202 may direct data to an appropriate system component for processing or storage, execute a program stored in the memory 4204 or receive and transmit data via the I/O unit 4206, or other similar function. The processing unit 4202 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more of the PLD 4208 can control the logical operations of the system. In an embodiment, the PLD 4208 acts as a reconfigurable processor, which can be reprogrammed as needed to handle a particular computing task. Alternately, the programmable logic device 4208 may itself include an embedded microprocessor. The memory unit 4204 may be a random access memory (RAM), read only memory (ROM), fixed or flexible disk media, PC Card flash disk memory, tape, or any other storage means, or any combination of these storage means.

The present invention has various advantages. Some embodiments of the present invention provide an M-bit width and N-bit size TDP/SDP memory block that can be used as two independent M-bit width and N/2-bit size SDP memory blocks. Certain embodiments of the present invention provide flexibility to a memory system. For a given memory area, the number of memory blocks and the bit density is often a tradeoff. For example, an embedded memory structure with large memory blocks often has a high bit density but a low block count. In contrast, an embedded memory with small memory blocks often has a low bit density but a high block count. Some embodiments of the present invention can satisfy different memory demands in FPGA applications. For example, some applications need large memory blocks with low block count. In contrast, other applications need small memory blocks with high block count. Depending on the applications, the M-bit width and N-bit size memory can be used as a single block for TDP or SDP operations, or used as two independent blocks for SDP operations. Certain embodiments of the present invention provide configurable memory block in FPGA fabric that supports a configurable data width and various operation modes including TDP, SDP and Single Port (SP) mode.

Figure 6:
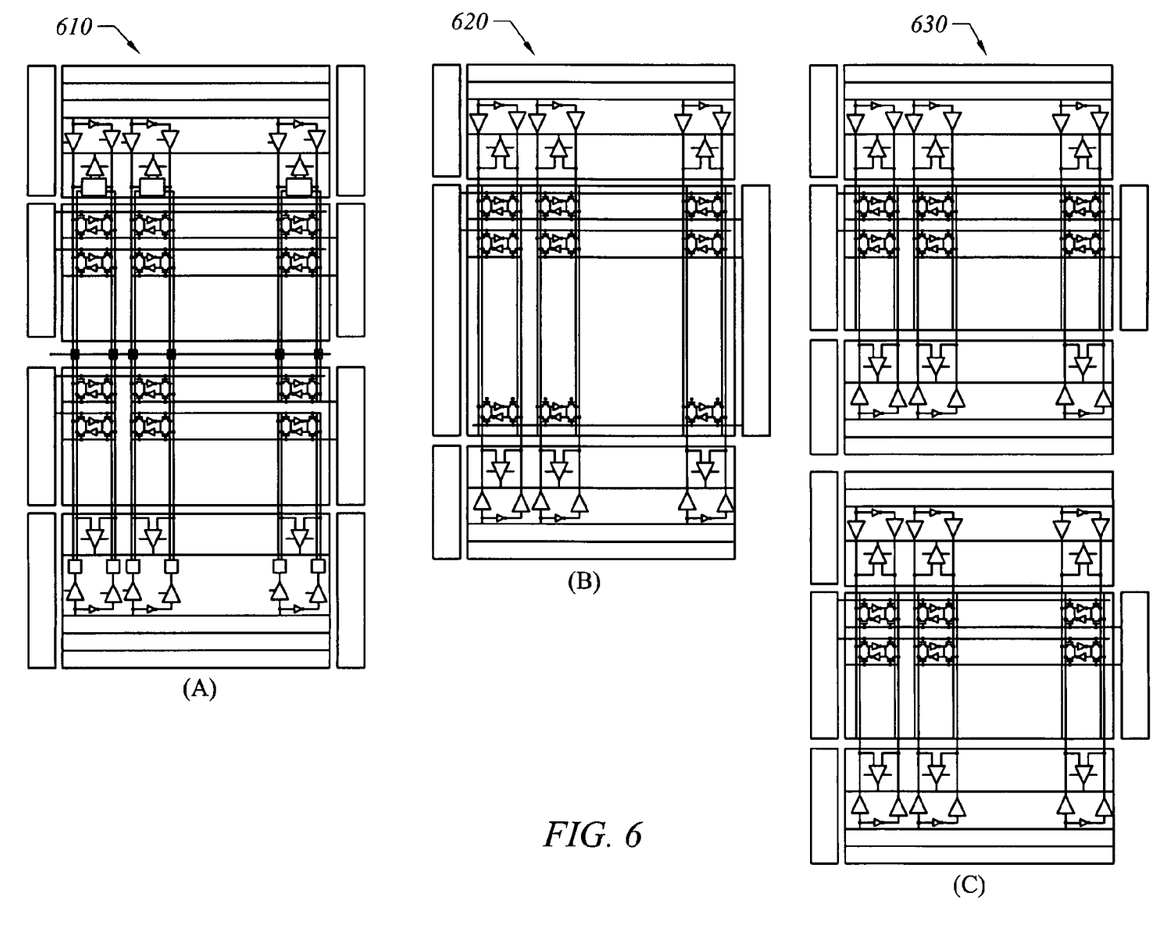

FIGS. 6(A), (B) and (C) show a simplified comparison between a divisible 32-bit width and 8K-bit size memory block and conventional memory structures according to an embodiment of the present invention. This diagram is merely an example, which should not unduly limit the scope of the claims herein. FIG. 6(A) shows a 32-bit width and 8K-bit size TDP/SDP memory block 610 that can support two independent 32-bit width and 4K-bit size SDP memory blocks according to an embodiment of the present invention. FIG. 6(B) shows a conventional 32-bit width and 8K-bit size TDP/SDP memory block 620 that cannot support two independent 32-bit width and 4K-bit size SDP memory block. FIG. 6(C) shows two independent 32-bit width and 4K-bit size TDP memory blocks 630. The silicon area of the memory block 610 is 1.13 of the memory block 620 and is 0.73 of the two memory blocks 630. Even though the memory block 610 is slightly larger than the memory 620, the memory block 610 is divisible and thus more flexible than the memory 620. On the other hand, the memory block 610 has a bit density higher than the memory blocks 630.

It is understood the examples and embodiments described herein are for illustrative purposes only and that various modifications or changes in light thereof will be suggested to persons skilled in the art and are to be included within the spirit and purview of this application and scope of the appended claims.

What is claimed is:

1. A random access memory circuit, the circuit comprising:
   a first array of memory cells including a first plurality of ports and a second plurality of ports;
   a second array of memory cells including a third plurality of ports and a fourth plurality of ports;
   a plurality of switches connected to the first plurality of ports and the third plurality of ports respectively or connected to the second plurality of ports and the fourth plurality of ports respectively;
   a plurality of sense amplifiers configured to receive a first plurality of signals selectively from at least the first plurality of ports and the second plurality of ports; and
   a plurality of write drivers configured to output a second plurality of signals selectively to at least the third plurality of ports and the fourth plurality of ports.

2. The random access memory circuit of claim 1, and further comprising a plurality of multiplexers configured to receive a third plurality of signals from at least the first plurality of ports and the second plurality of ports and output the first plurality of signals to the first plurality of sense amplifiers respectively.

3. The random access memory circuit of claim 2 wherein each of the plurality of multiplexers comprises four input ports connected to two of the first plurality of ports and two of the second plurality of ports respectively and two output ports connected to one of the first plurality of sense amplifiers.

4. The random access memory circuit of claim 3 wherein each of the plurality of multiplexers is configured to receive a control signal and generate output signals at the two output ports in response to the control signal.

5. The random access memory circuit of claim 2 wherein the plurality of switches are closed, and the plurality of multiplexers are further configured to receive the third plurality of signals from the first plurality of ports, the second plurality of ports, and the third plurality of ports.

6. The random access memory circuit of claim 1, and further comprising a plurality of demultiplexers configured to receive a third plurality of signals from the plurality of write drivers respectively and output the second plurality of signals to at least the third plurality of ports or at least the fourth plurality of ports.

7. The random access memory circuit of claim 6 wherein each of the plurality of demultiplexers comprises an input port connected to one of the plurality of write drivers and two output ports connected to one of the third plurality of ports and one of the fourth plurality of ports respectively.

8. The random access memory circuit of claim 7 wherein each of the plurality of demultiplexers is configured to receive a control signal and generate output signals at the two output ports in response to the control signal.

9. The random access memory circuit of claim 6 wherein the plurality of switches are closed, and the plurality of demultiplexers are further configured to output the second plurality of signals to the third plurality of ports, or the fourth plurality of ports and the second plurality of ports.

10. The random access memory circuit of claim 1 wherein each of the plurality of switches is configured to receive a control signal and is open or closed in response to the control signal.

11. The random access memory circuit of claim 10 wherein each of the plurality of switches comprises a pass gate.

12. The random access memory circuit of claim 1, and further comprising:
a second plurality of write drivers connected to at least the first plurality of ports; and
a second plurality of sense amplifiers connected to at least the fourth plurality of ports.

13. The random access memory circuit of claim 1, and further comprising:
a first plurality of bit lines connected to the first plurality of ports;
a second plurality of bit lines connected to the second plurality of ports;
a third plurality of bit lines connected to the third plurality of ports; and
a fourth plurality of bit lines connected to the fourth plurality of ports.

14. The random access memory circuit of claim 13 wherein the plurality of switches are connected to the first plurality of ports through the first plurality of bit lines and the third plurality of ports through the third plurality of bit lines, or connected to the second plurality of ports through the second plurality of bit lines and the fourth plurality of ports through the fourth plurality of bit lines.

15. A random access memory circuit, the circuit comprising:
a first array of memory cells including a first plurality of ports and a second plurality of ports;
a second array of memory cells including a third plurality of ports and a fourth plurality of ports;
a plurality of switches connected to the first plurality of ports and the third plurality of ports respectively or connected to the second plurality of ports and the fourth plurality of ports respectively;
a plurality of multiplexers configured to receive a first plurality of signals from at least the first plurality of ports and the second plurality of ports;
a plurality of sense amplifiers configured to receive a second plurality of signals from the plurality of multiplexers respectively;
a plurality of demultiplexers configured to output a third plurality of signals to at least the third plurality of ports or at least the fourth plurality of ports; and
a plurality of write drivers configured to output a fourth plurality of signals to the plurality of demultiplexers respectively.

16. The random access memory circuit of claim 15, and further comprising:
a second plurality of write drivers connected to at least the first plurality of ports; and
a second plurality of sense amplifiers connected to at least the fourth plurality of ports.

17. A method for configuring a random access memory, the method comprising:
providing a random access memory circuit, the circuit including:
a first array of memory cells including a first plurality of ports and a second plurality of ports;
a second array of memory cells including a third plurality of ports and a fourth plurality of ports;
a plurality of switches connected to the first plurality of ports and the third plurality of ports respectively or connected to the second plurality of ports and the fourth plurality of ports respectively;
a plurality of multiplexers configured to receive a first plurality of signals from at least the first plurality of ports and the second plurality of ports;
a plurality of sense amplifiers configured to receive a second plurality of signals from the plurality of multiplexers respectively;
a plurality of demultiplexers configured to output a third plurality of signals to at least the third plurality of ports or at least the fourth plurality of ports; and
a plurality of write drivers configured to output a fourth plurality of signals to the plurality of demultiplexers respectively;
receiving a first plurality of control signals by the plurality of switches respectively;
receiving a second plurality of control signals by the plurality of multiplexers respectively; and
receiving a third plurality of control signals by the plurality of demultiplexers respectively.

18. The method of claim 17 wherein:
determining to open or close the plurality of switches in response to the first plurality of control signals respectively;
determining a first relationship between the second plurality of signals and the first plurality of signals;
determining a second relationship between the third plurality of signals and the fourth plurality of signals.

19. The method of claim 18, and further comprising reading first data and writing second data from the first array of memory cells and the second array of memory cells in a TDP mode.

20. The method of claim 18, and further comprising:
reading first data or writing second data from the first array of memory cells in a first SDP mode; and
reading third data or writing fourth data from the second array of memory cells in a second SDP mode.

* * * * *